United States Patent [19]

Evalds

[11] 3,904,952

[45] Sept. 9, 1975

[54] SELF SYNCHRONIZING ZERO CROSSOVER SWITCHING CIRCUIT

[75] Inventor: Egils Evalds, Ardmore, Pa.

[73] Assignee: Athena Controls Inc., West Conshohocken, Pa.

[22] Filed: Jan. 10, 1974

[21] Appl. No.: 432,214

[52] U.S. Cl. .................................................. 323/24
[51] Int. Cl.² ............................................ G05F 1/10
[58] Field of Search........... 323/24, 38; 307/252 UA

[56] References Cited

UNITED STATES PATENTS

| | | | |
|---|---|---|---|
| 3,633,095 | 1/1972 | Hood | 323/38 |
| 3,660,686 | 4/1970 | Muskovac | 323/24 |
| 3,705,990 | 12/1972 | Pileckis | 307/252 UA |
| 3,806,793 | 4/1974 | Liss | 321/40 |

*Primary Examiner*—William H. Betta, Jr.
*Attorney, Agent, or Firm*—William E. Cleaver

[57] ABSTRACT

The present circuit employs three electronic switching means, two of which are arranged in complementary form so that if the line voltage has passed through its zero value the properly polarized switching circuit will be turned on. The third electronic switching circuit is connected to the first two switching circuits and is a bi-directional switching circuit that responds to conduct current in either a first or second direction depending upon which of the first two electronic switching circuits has been turned on.

7 Claims, 3 Drawing Figures

SELF SYNCHRONIZING ZERO CROSSOVER SWITCHING CIRCUIT

BACKGROUND

It has been recognized for some time that when electronic switching devices such as triacs and silicon controlled rectifiers, etc. are turned on at a point where the voltage applied across the anode to cathode is approaching the full amplitude of the applied signal there will result a surge of energy through the electronic switching device which will generate radio frequency signals which are quite undesirable. Accordingly there has been some endeavor to provide zero crossing detectors or simply switching circuits which are turned on at the zero crossing time of the applied signal.

In at least one prior art effort the zero voltage switching circuit includes a delay circuit so that the pulse which fires the electronic switching device fires the device slightly after the zero time. In this approach it is necessary to provide an elaborate timing circuit since the pulse time is critical and the delay must be carefully defined.

In at least one other approach to provide a zero voltage switching circuit there is a technique which employs the generation of a gate pulse, or a long pulse, which bridges the zero crossover point. In other words, the pulse begins before the applied signal reaches the zero crossover value and remains on until after the applied signal has gone through its zero value. In such an approach there is a waste of energy and such circuits have necessitated the use of large capacitors in order to store enough energy to accomplish the technique. In at least a third approach for providing a zero voltage switching circuit, which might be employed with three phase power there has been an elaborate arrangement of blocking circuits and timing circuits in order to enable the system to start as a single phase system and sense the phase timing and then lock in the remainder of the circuits so that the three phase timing aspect of the circuit is properly synchronized with the switching circuit.

SUMMARY

The present circuit is especially useful with a three phase power system because the circuit is self synchronized. In other words, the circuit itself determines what phase of the applied signal is present and only reacts when the applied signal is passing through the zero crossover and further determines whether the characteristic of the signal following the zero crossover is going either positive or negative and accordingly directs current to the load in the synchronized phase.

The circuit employs one portion as a detection section which senses whether or not the applied signal or line signal, is going positive or going negative. This detection section senses when the line signal goes through its zero value. At that point in time the circuit reacts to turn on a bi-directional switching circuit which conducts in accordance with the proper phase of the applied signal.

The objects and features of the present invention will be better understood in accordance with the description to follow, taken in conjunction with the drawings in which.

Figure 1:
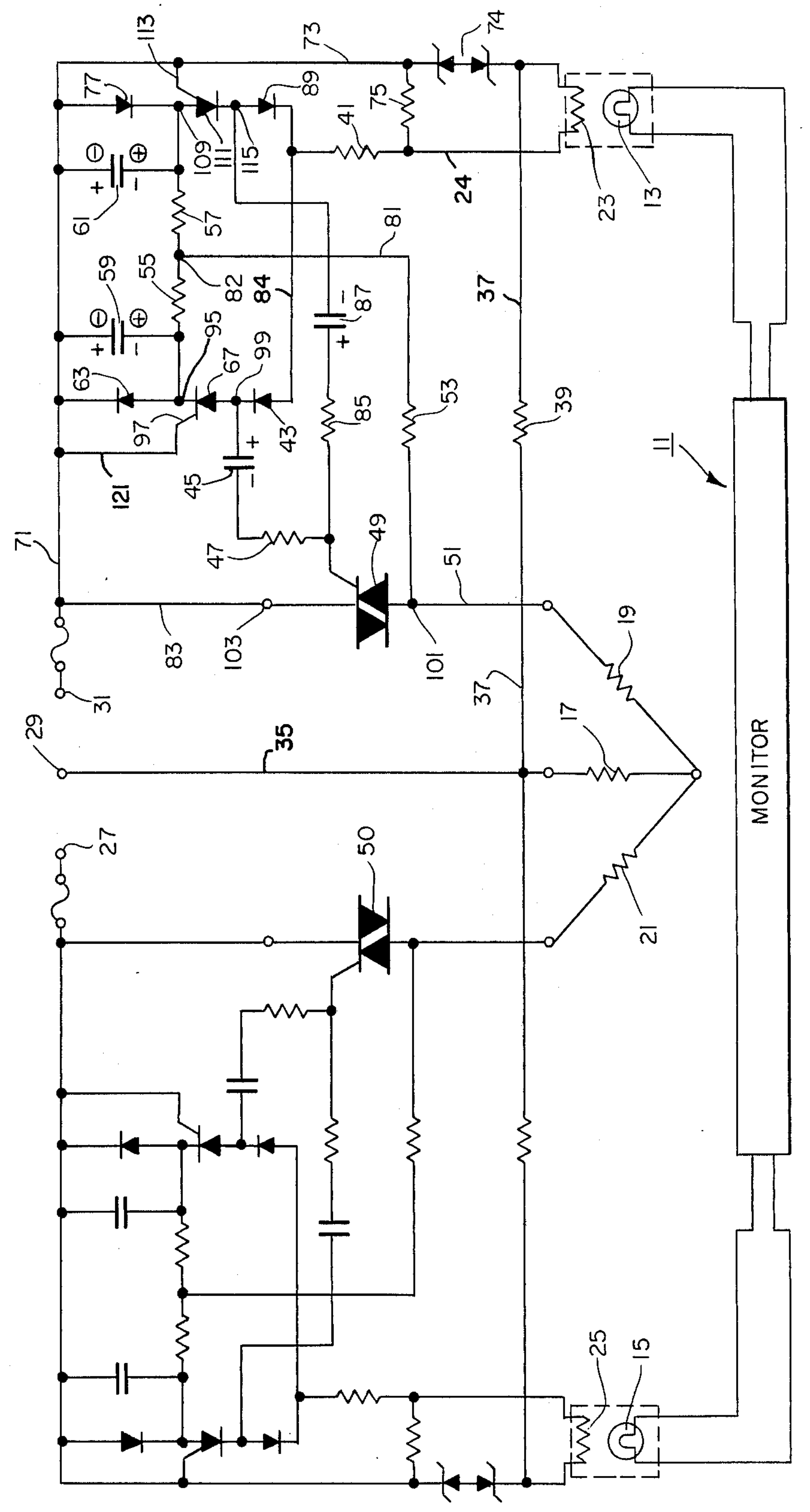
FIG. 1 shows the invention employing a triac as the bi-directional switching means.

In FIG. 1 there is shown a monitoring system 11 which will turn on the photocells 13 and 15 in response to the heat generator being required to supply more heat. In other words, when the lamps 13 and 15 are turned on, then there is a demand on the system for more heat and in particular on the circuit to provide more current to the respective loads 17, 19 and 21 to furnish that heat. The monitoring circuits can be any number of devices and are not related to the present invention other than to show a system with which the present invention would be used. Assume for the purposes of our description that the photocells 13 and 15 are turned on and therefore the photosensitive resistors which respond to those photocells, namely, photo sensitive resistors 23 and 25 are lowered in resistance so that the circuits which are connected thereto are fully conducting.

Consider that there is three phase power applied to the terminals 27, 29 and 31. Further, let us initially consider only the reaction to the three phase power when there is an applied signal as shown in the first quadrant 33 of the signal shown in FIG. 3, and let us further assume that the signal swings positive and negative with respect to terminal 29, while terminal 31 is at ground. As the applied voltage goes positive a small amount of current will flow from terminal 29, along line 35, along line 37, through resistor 39, through resistor 23, up along line 24, to the right through resistor 75, along lines 73 and 71, to the terminal 31. A small amount of current flows because because the value of resistor 75 is high. In addition, a larger amount of current will flow from the terminal 29 along line 35, through the load resistors 17 and 19, along line 51, to the right through resistor 53, along line 81 to the left through resistor 55, to charge capacitor 59 and simultaneously through the diode 63 to line 71, and therefore to the other side of the line terminal 31. It should be noted that the current conducts in two directions from terminal 82, the other direction being to the right through resistor 57 to charge capacitor 61 and to apply a positive potential to the anode 109 of the programmed unijunction transistor 111 hereinafter referred to as PUT 111.

During this first cycle we will not concern ourselves with the operation of PUT 111 because its operation is not meaningful insofar as the purpose of this invention is concerned until capacitor 87 is charged as shown and that does not take place until the applied signal is in quadrant 69 as will be explained hereinafter. However, we need to follow one other current path which is important to the operation of the circuit. Electrical current will flow from terminal 29, along line 35, to the right along line 36 through resistor 39, down and through resistor 23, up along line 24 through resistor 41, to the left along line 84, through diode 43, to the left from anode 99 to charge capacitor 45 as shown, through resistor 47, through the triac 49 (by virtue of the leakage current) to terminal 31. Accordingly the capacitor 45 is charged as shown during the first quadrant 33 of the applied signal shown in FIG. 3.

Now as the applied signal goes through the second quadrant 65 (FIG. 3) there is no major effect on the circuit because the capacitor 45 has no discharge path unless the silicon-controlled rectifier 67 is turned on. However, the capacitors 59 and 61 commence discharging and are virtually discharged at the end of the second quadrant 65.

When the applied signal enters the third quadrant 69, the terminal 31 will be relatively positive since the terminal 29 will be going negative. At this time, there will be a small current flow from the terminal 31 through the fuse, along line 71, along line 73, to the left through the resistor 75, along the line 24, through the resistor 23, up and to the left through resistor 39, along lines 37 and 35, to the other side of the line; i.e., terminal 29. Now it should be noted that at this time, the gate 97 of the silicon controlled rectifier 67 is relatively positive because it is connected directly through line 71 to the terminal 31. At the same time it should be noted that the cathode 95 of the silicon controlled rectifier 67 is relatively negative because it is connected through the resistor 55, along the line 81, through the resistor 53, along the line 51 through resistors 19 and 17 to the negative terminal 29. In addition, there is a negative potential commencing to be developed on the capacitor 59, as shown by the polarity signs which are not circled. Further, it can be readily determined that the anode 99 of the silicon-controlled rectifier 67 is positive, since it is connected to the charged capacitor 45.

Accordingly, the silicon-controlled rectifier 67 conducts, enabling the capacitor 45 to discharge through the path made up of SCR 67, diode 63, line 71, cathode to gate to triac 49 and resistor 47.

Now when the silicon-controlled rectifier 67 conducts, the point 99 goes relatively negative with respect to the potential at 31, and therefore the charge stored at the capacitor 45 is measured from a new negative reference and provides a negative pulse to the gate of the triac 49, thereby rendering the triac 49 conductive from terminals 103 to 101. Hence there is heavy current flow from terminal 31, along line 83, through the traic 49, along line 51, through the load resistors 19 and 17, along line 35, to terminal 29.

It should be understood that during the third quadrant, whether or not triac 49 has fired, current will flow from the cathode to the gate of triac 49, and on through resistor 85 to charge the capacitor 87. The current path from capacitor 87 continues through terminal 115, through the diode 89, through the resistor 41, along line 24, through the resistor 23, up and to the left through resistor 39, along lines 37 and 35, to terminal 29. It should be apparent then that shortly after the zero crossover, identified as 66 in FIG. 3, there will be heavy current flow through the load resistors 19 and 17, from the terminal 31 to the terminal 29. At the same time, the capacitor 87 will be charged as shown.

Figure 3:
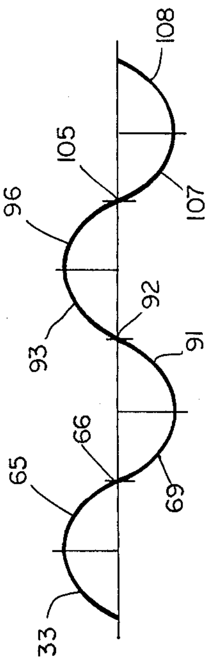
FIG. 3 is a graphic display of an applied wave signal broken up into sections for purpose of discussion with respect to the operation of the circuit.

When the applied signal is in the quadrant 91, (FIG. 3) there is very little major effect on the circuit because the PUT 111 is not turned on which is necessary for the capacitor 87 to discharge. However, the capacitors 59 and 61 commence discharging and are virtually fully-discharged by the time the applied signal reaches the zero crossover 92 (FIG. 3). It should be noted that the role of capacitor 61 is similar to the role of capacitor 59 (with respect to SCR 67); i.e., to insure that the PUT 111 does not turn on, during the third quarter of the applied signal, and this is effected by providing a negative polarity to the anode 109.

As the applied signal goes from quadrant 91 to 93 and goes through the zero crossover 92, the terminal 29 commences becoming positive and the terminal 31 negative. When this happens the same current flow as described earlier takes place; however, there is one significant additional difference. When the positive potential is applied to the anode of PUT 111 as described earlier, the point 115 will be relatively negative since capacitor 87 is charged. In addition the gate 113 will be relatively negative and thus PUT 111 will conduct. When PUT 111 conducts the point 115 will go relatively positive and hence the potential across capacitor 87 will be measured from a new positive level. Accordingly, the charge stored on capacitor 87 will provide a positive pulse to the triac 49, thereby turning on the triac 49 to conduct in the direction from terminal 101 to 103. As a result there will be heavy current flow from terminal 29, along line 35, through the load resistors 17 and 19, along the line 51 through the triac 49, along line 83 to the negative terminal 31. It should be noted that this occurs immediately after the applied signal goes through the zero crossover 92. When the PUT 111 conducts, it provides current through the diode 89, along the line 84 to recharge the capacitor 45, as shown, so that capacitor is ready for the second half of the second cycle; i.e., quadrant 107, to turn on the triac 49 to provide load current therethrough in response to the silicon-controlled rectifier 67 conducting at that time.

The role of resistor 23 in the circuit is to provide a variable resistor means. When the light 13 is on, there will be a low impedance across resistor 23, thereby enabling current to be provided to charge up capacitors 45 and 87, and these charged capacitors are necessary to fire the triac and provide load currents. When the light 13 is not turned on, the resistor 23 has a relatively high impedance, therefore there is insufficient current to charge capacitors 45 and 87.

It should be apparent then that the current flow through the load resistors 19 and 17 can be in two different directions, depending upon whether there is a positive pulse or a negative pulse applied to the gate terminal of traic 49, and further depending upon whether the terminals 31 and 29 are respectively positive or negative. This current flow will be in phase with the polarities of the signal applied to the terminals 31 and 29. The system enables the current flow through the load to be in phase because the capacitors 45 and 87 are properly charged in the preceding half of the cycle, so that during the succeeding half of the cycle (in which these capacitors provide the pulse to the gate of triac 49), they can operate to turn on that triac 49 which in turn conducts load current in the proper direction.

Figure 2:
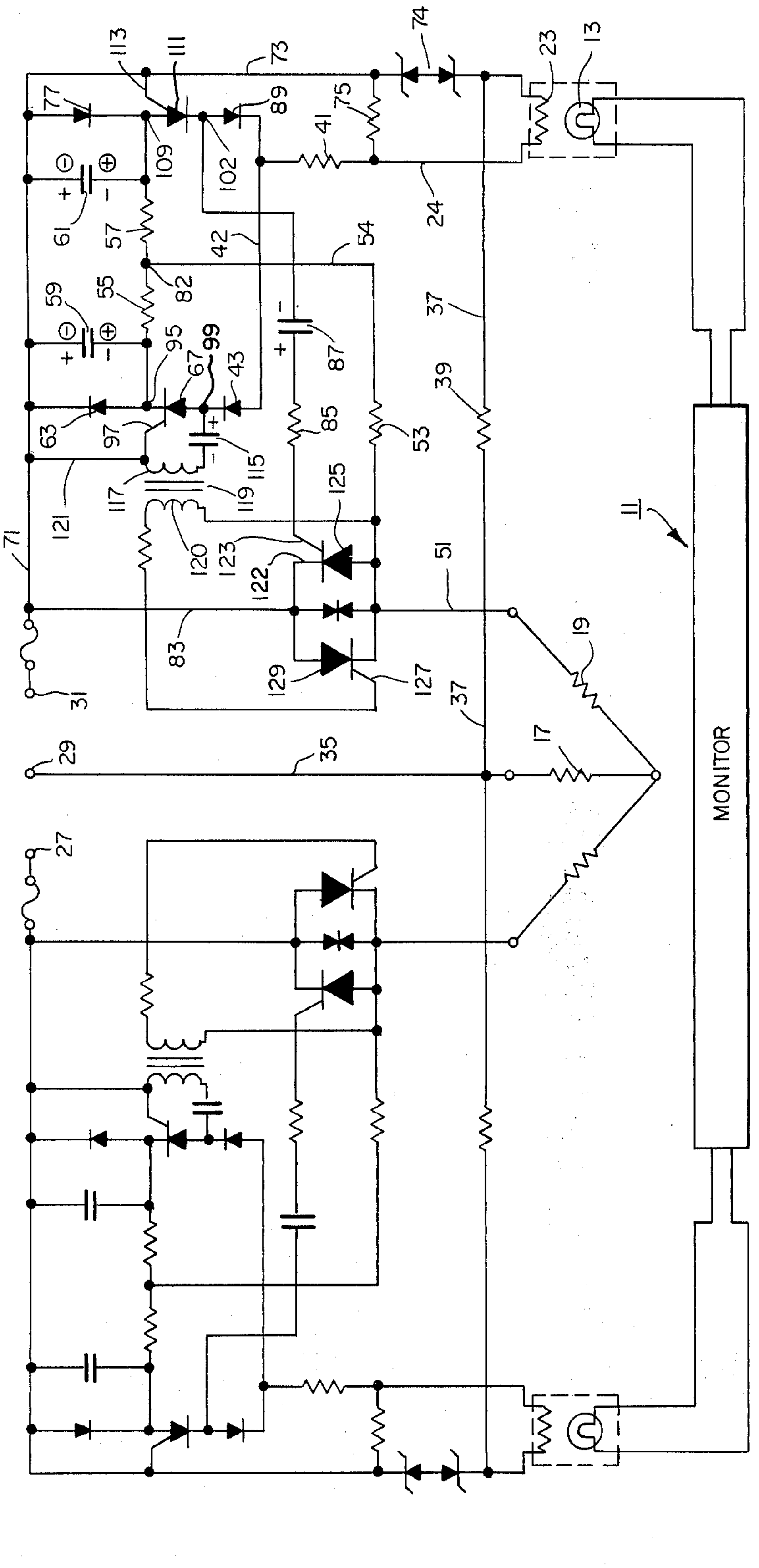
FIG. 2 shows the invention employing a pair of silicon controlled rectifiers as the bi-directional switching circuit.

The circuit of FIG. 2 operates quite similarly to the circuit of FIG. 1, except that there is a pair of silicon controlled rectifiers 125 and 129 which act as the bidirectional switching means to permit the load current through the load resistors 17 and 19 to conduct. Once again, consider that the signal shown in FIG. 3 is applied to the terminals 29 and 31 and that terminal 29 goes positive during the first half of the cycle. Also consider that the monitoring light 13 is turned on, thereby rendering the resistor 23 in its low resistance state.

When the signal is in quadrant 33, there will be a small amount of flow from the terminal 29 along line 35, to the right along line 37, through the resistor 39, downward through the resistor 23 and along line 24, through the resistor 75, along lines 73 and 71 to the other side of the line.

At the same time, there is a larger amount of current flowing from terminal 29 along line 35, through the load resistors 17 and 19, upward along line 51, to the right through resistor 53, upward along line 54, to the left through resistor 55 to charge the capacitor 59 as shown by the polarity signs which are encircled. Current also flows in parallel through the diode 63. During this time the current passing along line 54 also conducts to the right through resistor 57 to charge up the capacitor 61, as shown by the polarity signs encircled. At the same time this circuit path provides a positive potential to the anode 109 of the PUT 111. As in our discussion with respect to the circuit shown in FIG. 1, we will not consider the operation of PUT 111 until we have considered how capacitor 87 is charged as shown. At the same time there will be current flow through the diode 43, to charge up the capacitor 115 as shown. The remainder of the circuit path is through the primary winding 117, along line 121 to line 71 and terminal 31. The capacitors 59 and 61 play the same role in this circuit as they did in the circuit shown in FIG. 1; i.e, they respectively keep the silicon-controlled rectifier 67 from conducting during the first quarter of the cycle and the PUT 111 from conducting during the third quarter of the cycle.

During the second quadrant 65, there are no major changes except that the capacitors 59 and 61 experience a discharge and are virtually discharged by the time the applied signal goes through the zero crossover 66.

At zero crossover time 66, the terminal 29 commences going negative while the terminal 31 would be relatively positive. Accordingly there is a small current flow from the terminal 31 along lines 71 and 73 to the left through resistor 75, down along line 24, through the resistor 23, back up and to the left through resistor 39, along the lines 37 and 35 to terminal 29.

At this time it should be noted taht there is a relatively positive signal applied to the line 121 and hence to the gate 97 of the silicon-controlled rectifier 67. The cathode 95 of the silicon-controlled rectifier 67 is relatively negative because it is tied directly through the resistor 55 and 53, through the line 51, through the resistors 19 and 17 to the negative terminal 29. In addition the anode 99 of SCR 67 is positive because of the charge on capacitor 115. Hence the silicon-controlled rectifier 67 is caused to conduct thereby enabling capacitor 115 to discharge through SCR 67, diode 63 line 121 and winding 117. The discharge current through winding 117 induces a positive potential at the upper end of winding 120. This induced signal provides a positive potential on the gate 127 of the silicon-controlled rectifier 129, and hence there is current flow from the terminal 31, along line 83, through the silicon-controlled rectifier 129, along the line 51, through the load resistors 19 and 17 to the terminal 29. During the third quadrant, there is leakage current flowing along line 83, through the cathode 122 and the gate 123 of SCR 125, through the resistor 85, to charge the capacitor 87 as shown. The current path to charge capacitor 87 continues through the diode 89 through resistor 41, along line 24, through resistor 23, along lines 37 and 35 to terminal 29. Hence the capacitor 87 is charged at the end of quadrant 69, as shown.

During the quadrant 91, there are very few major changes excepting that the capacitors 59 and 61 experience a discharge and are virtually discharged by the time the applied signal reaches the zero crossover 92.

When the applied signal reaches the zero crossover 92, the terminal 29 commences going positive while the terminal 31 would be relatively negative.

The same current flow will occur as described earlier but one additional action will take place. When the anode of PUT 111 is positive, as described earlier, its cathode will be negative because of the charge on capacitor 87. Since the gate 113 will be relatively negative, PUT 111 will conduct. When PUT 111 conducts, the point 102 will go relatively positive and therefore the charge on capacitor 87 will be measured from a new positive reference. The charge on capacitor 87 will cause a positive pulse to be applied to the gate 123 of the silicon-controlled rectifier 125. Accordingly, the silicon-controlled rectifier 125 will be turned on, providing heavy current flow from terminal 29, along the line 35, through the load resistors 17 and 19, along line 51, through the silicon-controlled rectifier 125, along the line 83 to the terminal 31.

Hence it should be apparent that the circuit shown in FIG. 2 also provides "in phase" current flow through the loads 17 and 19 and this is accomplished by providing a properly polarized charge on the capacitors 115 and 87 during the half cycle prior to the half cycle in which they are to be effective.

I claim:

1. A self-synchronizing zero cross-over switching circuit comprising in combination: at least first and second applied signal terminals adapted to have an alternating current signal with zero cross-over characteristics applied thereto; first and second signal storage means; bi-directional current switching means having control current conducting means, first current conducting means, and second current conducting means, said first current conducting means connected to said first applied signal terminal; first circuitry means connecting said second current conducting means to said second applied signal terminal; second circuitry means connecting said first signal storage means to said control current conducting means; third circuitry means connecting said first signal storage means to said second applied signal terminal, said third circuitry means including a first unidirectional electrical current conducting means whereby when said second applied signal terminal has a positive voltage polarity relative to said first applied signal terminal, said first signal storage means will develop a voltage there across; fourth circuitry means connecting said second signal storage means to said control current conducting means; fifth circuitry means connecting said second signal storage means to said third circuitry means, said fifth circuitry means including a second uni-directional electrical current conducting means whereby when said first applied signal terminal has a positive signal relative to said second applied signal terminal, said second signal storage means will develop a voltage thereacross; signal switching network means connected to said third and fifth circuitry means as well as to said first applied signal terminal and said first circuitry means whereby when said second applied signal terminal experiences a zero cross-over with the applied signal going negative thereat, said first signal storage means will apply a negative pulse to said control current conducting means causing said bi-directional current switching means to conduct electrical current from said first applied signal terminal to said second applied signal terminal and whereby when said second applied signal terminal experiences a zero cross-over with the applied signal going positive thereat, said second signal storage means will apply a positive pulse to said control current conducting means causing said bi-directional current switching means to conduct electrical current from said second applied signal terminal to said first applied signal terminal.

2. A self-synchronizing zero cross-over switching circuit according to claim 1 wherein said signal switching network means includes first and second signal switching means each having an input element, an output element, and a control element, and wherein said input element of said first signal switching means is connected between said first uni-directional electrical current conducting means and said first signal storage means, and wherein said control element and said output element of said first signal switching means are connected to said first applied signal terminal, and wherein said output element of said second signal switching means is connected between the said second uni-directional current conducting means and said second signal storage means, and further wherein said control element and said input element of said second signal switching means are connected to said first applied signal terminal, and further wherein said signal switching network means includes a first biasing circuit connected to said output element of said first switching means and said input element of said second switching means and said first applied signal terminal.

3. Self-synchronizing zero cross-over switching circuit according to claim 1 wherein said first circuitry means includes load means for translating said current passing through said bi-directional current switching means into a load output.

4. A self-synchronizing zero cross-over switching circuit according to claim 1 wherein said second circuitry means includes a variable resistor means and wherein there is further included means to vary said variable resistor means whereby when said variable resistor means is varied in one direction, current is conducted through said bi-directional current switching means in response to said zero cross-over switching circuit experiencing a zero cross-over of said applied signal and whereby when said variable resistor means has its resistance varied in another direction, said self-synchronizing zero cross-over switching circuit is not responsive to a cross-over of said applied signal.

5. A self-synchronizing zero cross-over switching circuit according to claim 1 wherein said bi-directional current switching means is a triac.

6. A self-synchronizing zero cross-over switching circuit according to claim 1 wherein said bi-directional current switching means is a pair of silicon-controlled rectifiers and wherein said second circuitry means is a pulse transformer.

7. A self-synchronizing zero cross-over switching circuit according to claim 2 wherein there is further included a second biasing network connected to said first biasing network and connected to said first applied signal terminal whereby said first signal switching means is biased so that it cannot conduct during that portion of the applied signal that said second signal switching means will be conducting and wherein said second signal switching means is biased so that it will not conduct during that portion of the applied signal that said first signal switching means will be conducting.

* * * * *